United States Patent [19]
Fujita et al.

[11] Patent Number: 4,899,108
[45] Date of Patent: Feb. 6, 1990

[54] HIGH FREQUENCY COIL

[75] Inventors: Michiru Fujita; Masao Higuchi, Kawasaki, both of Japan

[73] Assignee: Fuji Electric Co., Ltd., Kawasaki, Japan

[21] Appl. No.: 235,313

[22] Filed: Aug. 17, 1988

[30] Foreign Application Priority Data

Aug. 21, 1987 [JP] Japan ................................. 62-207635
Aug. 21, 1987 [JP] Japan ................................. 62-207636
Dec. 25, 1987 [JP] Japan ................................. 62-329133

[51] Int. Cl.$^4$ .......................................... G01R 33/20
[52] U.S. Cl. .................................................. 324/318
[58] Field of Search ............... 324/318, 307, 309, 322; 128/653

[56] References Cited

U.S. PATENT DOCUMENTS

| | | | |
|---|---|---|---|
| 4,613,837 | 9/1986 | Blass et al. | 324/318 |
| 4,712,067 | 12/1987 | Roschmann et al. | 324/318 |
| 4,752,738 | 6/1988 | Patrick et al. | 324/309 |
| 4,766,383 | 8/1988 | Fox et al. | 324/318 |

Primary Examiner—Michael J. Tokar
Assistant Examiner—Louis M. Arana
Attorney, Agent, or Firm—Spencer & Frank

[57] ABSTRACT

A high frequency coil is constructed by combining a plurality of unit coil having two saddle shaped coils which are vertically symmetric to each other. Each unit coil is disposed so as to locate the line sections of each saddle shaped coil on an outer peripheral surface of an elliptic cylinder. Assuming the plane perpendicular to the central axis of the elliptic cylinder is an x-y plane, major axis of an ellipse on the x-y plane as x axis and minor axis thereof as y axis, the angle between the x axis and the line extending from origin to the line section located in a first quadrant chosen among the line sections of each unit coil is assumed as $\theta$. The optimum angle $\theta_{op}$ is determined in such a way that when power series expansion relative to y over the magnetic flux density distribution on the y axis of the magnetic flux generated by the high frequency coil is performed, the angle at which the coefficient of the terms with up to degrees of 2N or 2N−2, N is a number of the unit coil, become zero. It is possible to obtain a high frequency magnetic field having exactly uniform magnetic flux density by means of directing $\theta$ to $\theta_{op}$ or near by $\theta_{op}$.

15 Claims, 8 Drawing Sheets

HIGH FREQUENCY COIL

1. Field of the Invention

The present invention relates to a high frequency coil for resonating atomic nuclei by radiating a high frequency electromagnetic wave to an object and serving as an antenna for receiving the resulting resonance signal in a nuclear magnetic resonance type computer tomogram imaging instrument (referred to as an MRI hereinafter).

2. Description of the Prior Art

When this type of high frequency coil serves to resonate atomic nucleuses by radiating a high frequency electromagnetic wave to an object and as an antenna for receiving the resulting resonance signal, the performance of this coil greatly affects quality of an image such as positional slippage of an object and sharpness, so that great care is taken to the form and structure of a high frequency coil.

One of the important features of a high frequency coil is to generate a high frequency magnetic field at very uniform density in the range of space to be imaged.

When the high frequency electromagnetic wave having the same frequency as a resonance frequency is radiated in the direction perpendicular to the direction of a static magnetic field, the nuclear magnetic resonant phenomenon causes the magnetic moment of nuclear spin to perform precession with a gradient of an angle α (rad), obtained by the following equation, relative to the direction of a static magnetic field.

$$\alpha = \gamma \cdot B_{RF} \cdot t \qquad (1)$$

where, $\gamma$: constant $\{=2.6752 \times 10^8 \text{ (rad/sec·T)}\}$
$B_{RF}$: high frequency magnetic flux density (T)
t: high frequency electromagnetic wave radiation time (sec)

It indicates that if a high frequency magnetic field has inferior uniformity, or if the high frequency magnetic flux density $B_{RF}$ value has variation in the space to be imaged, α is made variable in such a way that the radiation of a high frequency pulse for obtaining α of 90° may result in 80° or 100° gradient with which a nuclear magnetic resonant performs precession. A similar phenomenon occurs when the coil receives a resonant signal, so that the intensity of the received signal from nuclear spin in the space to be imaged may be variable. Such large variation is an obstacle to obtaining an excellent image.

Figure 1:
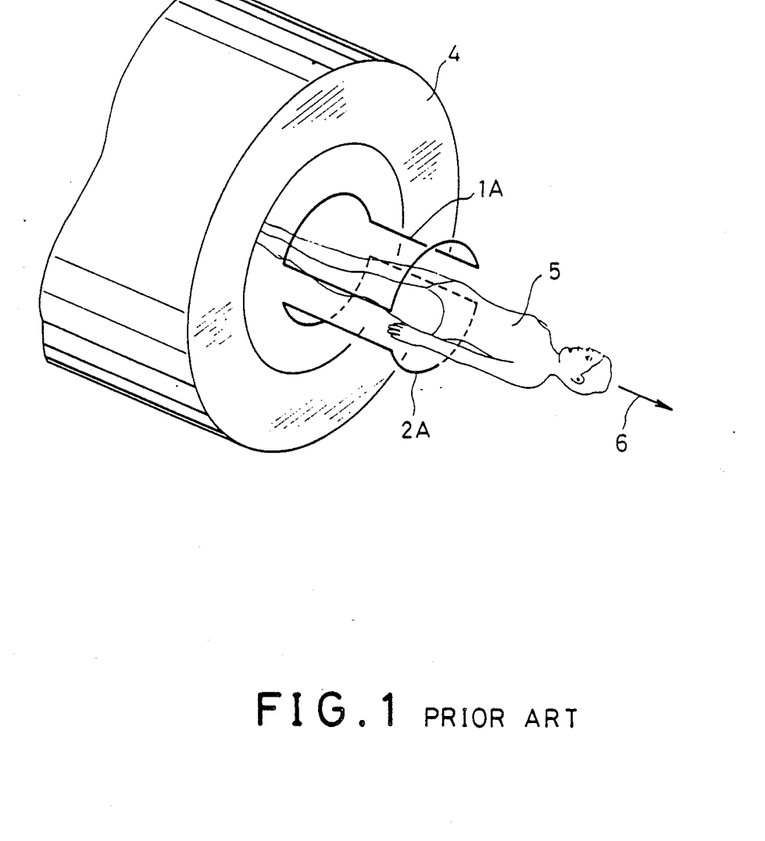
FIG. 1 is a perspective view showing use of a high frequency coil.

It is necessary to apply a high frequency magnetic field in the direction perpendicular to the direction of a static magnetic field generated by a magnet. In the case of the MRI utilizing a superconductive magnet as the magnet, since an axis of a human body used for an object, as shown in FIG. 1, coincides with the direction of a static magnetic field generated by a magnet 4, saddle shaped coils 1A and 2A shown in FIG. 1 are commonly used for a high frequency coil.

Figure 2:
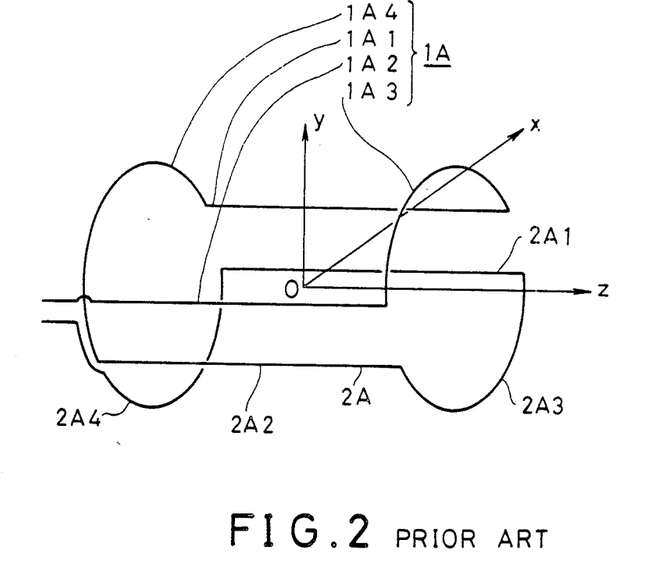
FIG. 2 is a perspective view showing a conventional high frequency coil.

FIG. 2 is a perspective view showing an arrangement of a conventional high frequency coil. The high frequency coil is composed of two saddle shaped coils 1A and 2A, which are positioned up and down and are vertically symmetric. Each of the saddle shaped coils, respectively, include two line sections 1A1, 1A2 and 2A1, 2A2 respectively located in parallel with each other and two arc sections 1A3, 1A4 and 2A3, 2A4. They are shaped by bending one conductor.

A central point in the space enclosed by two saddle shaped coils 1A and 2A is assumed as an origin 0, an axis on the plane provided in parallel with the plane containing the line sections 1A1 and 1A2 and passing through the origin vertically to the line sections is assumed as a x axis, an axis perpendicular to the x axis and passing through the origin is assumed as a y axis and an axis provided in parallel with the line sections is assumed as a z axis. In terms of each x, y or z coordinate axis of the three-dimensional coordinate axes arranged as mentioned above, these saddle shaped coils are symmetric relative to the z-x plane containing the z and x axes, the x-y plane containing the x and y axes and the y-z plane. The origin 0 can be also set as a center of an object section in case of imaging a section of an object. The high frequency magnetic field generated by this high frequency coil has a symmetric distribution relative to three symmetric planes like the above-mentioned high frequency coil arrangement. The high frequency magnetic fields generated by the straight sections at the center of the saddle shaped coils 1A and 2A are both distributed along the y axis and the current flows through these coils so as to add both magnetic fields generated by these coils to each other, that is, direct the generated magnetic fields in the same direction. As the magnetic field generated around the curved portions of the coils 1A and 2A are farther away from the origin, they have more x and z magnetic field components, so that the magnetic field is progressively distorted. This type of distortion is substantially defined by the magnetic fields generated by the line sections of the saddle shaped coils. When the line sections are longer than a predetermined length, the arc sections have little influence the magnetic fields and this influence level is negligent at the outline design stage. It means that the uniformity of the high frequency coil is under substantial control of the positional relationship between the line sections.

Figure 3:
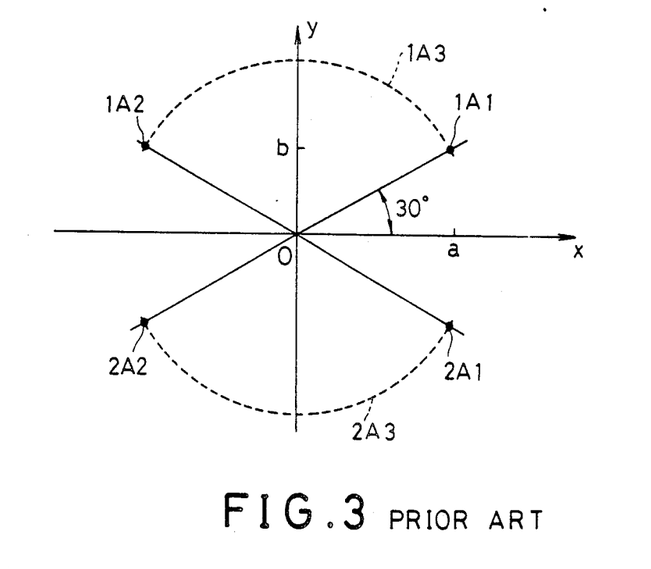
FIG. 3 is a sectional view cut along the x-y plane of the conventional high frequency coil.

FIG. 3 is a sectional view showing the high frequency coil through the coil in the x-y plane. The positional relation between the line sections of the high frequency coils is apparent from this view. The line extending from the origin 0 to the conductor 1A1 located in a first quadrant meets the x axis at an angle of 30°. The conductor 1A2 is symmetric to the conductor 1A1 relative to the y axis. The conductors 2A1 and 2A2 are respectively symmetric to the conductors 1A1 and 1A2 relative to the x axis. This position is one of the optimum constructions for generating uniform magnetic fields by means of these saddle shaped coils 1A and 2A. Hence, the saddle shaped coil type high frequency coils employed in the conventional MRI are all arranged on the basis of this condition.

There are two methods of representing magnetic field distribution uniformity of this type of coil. Thus, the optimum condition for the uniformity is a bit different according to each method. One is a method which identifies the optimum condition as a codition that the order of deleted terms is higher when the magnetic flux distribution on the y axis is represented by a power series of y. The other is a method which chooses several representative points in the object space requiring uniformity and identifies the optimum condition as a condition for the lowest variation of the magnetic flux densities at these points. Strictly speaking, the optimum conditions obtained by these methods are different from each other. Yet, in actuality, the difference between them is small, so that the method to be chosen depends upon the difficulty in searching for the optimum condition. For example, when numerical calculations are used for searching for the optimum condition at the design stage, it is proper to employ the former method for increasing order of deleted terms in power series and, in estimating the uniformity provided by the manufactured high frequency coil, the latter is the best. Naturally, it is possible to obtain the condition for the lowest variation of magnetic flux density in the object space by means of numerical calculations and identify it as an optimum condition.

If we let B(y) be the y-direction magnetic flux density distribution on the y axis about the density of the magnetic flux generated by two vertically symmetric saddle shaped coils and also let $G_{2m}$ be a coefficient of the 2m-th order term produced by expanding B(y) in a power series on y, B(y) is represented by the following equation.

The terms with odd orders are deleted in consideration of symmetry of the saddle shaped coils.

$$B(y) = B_0 + G_2 y^2 + G_4 y^4 + G_6 y^6 + \cdots + G_{2m} y^{2m} + \ldots \quad (2)$$

where, $B_0$: Magnetic flux density on the origin $G_{2m}$: Coefficient of the 2m-th order term and function relative to the value of (a, b) corresponding to the position of the line section.

When the length of the line section is assumed as being an infinite length and the size of the section of the conductor section is ignored, B(y) is represented by the following equation as has been well known, heretofore.

$$B(y) = \frac{2\mu_0 I}{\pi} \cdot \frac{a}{\{a^2 + (y - b)^2\}} \quad (3)$$

where, a: x coordinate in the line section 1A1
b: y coordinate in the section 1A1
I: Current value in the conductor of a high frequency coil
$\mu_0$: Magnetic permeability in vacuum $B_0$ is B(0). The coefficient of the 2m-th order term $G_{2m}$ can be calculated by differentiating b(y) 2m times with respect to y as shown in the following equation.

$$G_{2m} = \frac{1}{(2m)!} \cdot \frac{d^{2m} B(0)}{dy^{2m}} \quad (4)$$

$B_0$ and $G_2$ are obtained by applying this equation (4) to the equation (3) as shown below.

$$B_0 = \frac{2\mu_0 I}{\pi} \cdot \frac{a}{(a^2 + b^2)} \quad (5)$$

$$G_2 = \frac{2\mu_0 I}{\pi} \cdot \frac{(3b^2 - a^2)}{(a^2 + b^2)^3} \quad (6)$$

The condition for setting $G_2$ to 0 is represented by the following equation.

$$3b^2 - a^2 = 0 \quad (7)$$

This equation represents that the line extending from the origin to the position of the line section, meets the x axis at an angle of 30°. Thus, this condition is the same as the optimum condition for the conventional saddle shaped coils mentioned above.

As described above, the conventional saddle shaped coil type high frequency coil has achieved high uniformity of a magnetic field by locating two saddle shaped coils each composed of a one turn conductor in a vertically symmetric manner, making the line sections meet the x axis at an angle of 30° and deleting the $y^2$ term shown in the equation (2).

Recently, the needs have increased for reducing a size of a high frequency coil from both aspects of improving MRI performance and lowering cost. It is necessary to rationally design and manufacture various kinds of coil groups located in the magnet for reducing the inner radial size of the magnet such as a superconductive magnet. Since, in particular, the high frequency coil is located outside of a human body which is used for an object, the size of it restricts the sizes of all coils located outside of this high frequency coil. Thus, the reduction of the size of the high frequency coil greatly contributes to the reduction of the size of the MRI system. Furthermore, for reducing a checking time, it is necessary to efficiently radiate a high frequency electromagnetic wave and receive a resonance signal and thus, it is preferable to locate the high frequency coil near an object body. A further characteristic required for the high frequency coil, however, is uniformity of the generated high frequency magnetic field as described above. The reduction of a size of a high frequency coil in same scale results in the reduction of the space in which uniform high frequency magnetic field is maintained, which becomes smaller than a necessary size for the space. Consequently, for reducing a size of a high frequency coil, it is to be understood that it is necessary to provide a coil for maintaining a large uniform magnetic field space without having to enlarge the coil in size. The conventional high frequency coil is constructed by locating two saddle shaped coils in a vertically symmetric manner as described above, so that it is not possible to improve uniformity any longer.

SUMMARY OF THE INVENTION

It is an object of the present invention to provide a high frequency coil for generating a highly uniform high frequency magnetic field, which is reduced in size and maintains a predetermined uniform magnetic field in a necessary space.

In a first aspect of the present invention, a high frequency coil comprises:

a plurality of unit coils having a first elementary coil including two line sections in parallel with each other and a second elementary coil including two line sections in parallel with the two line sections of the first elementary coil;

each of the four line sections included in the unit coil being provided on an outer peripheral surface of an elliptic cylinder and having substantially its longitudinal center on a plane perpendicular to the line sections;

the four line sections included in each unit coil occupying respective corners of a rectangle on the plane, each of the rectangles formed of the unit coils including a common central point and corresponding sides of each rectangles being disposed in parallel with each other; and the line sections in each unit coil respectively being electrically connected so as to generate a magnetic flux in the same direction at the common central point.

Here, let the common central point represent an origin of a coordinate system, let one of the major axis and the minor axis of an ellipse formed in section of the elliptic cylinder cut along the plane represent an x axis and the other one represent a y axis, and let an angle between the x axis and a line extending from the origin to a position of the line section located in a first quadrant of the x-y plane chosen among the four line sections of each unit coil be $\theta$, the angle $\theta$ may be within the range of an optimum angle $\theta_{op} \pm 5°$, the optimum angle $\theta_{op}$ being determined as the angle of each unit coil provided in such a manner that the coefficients of the terms up to order twice as many as the number of coils become zero except the 0th order term among the coefficients of terms provided, when power series expansion relative to y is performed over the distribution on the y axis of the magnetic flux density generated by the high frequency coil.

The first elementary coil included in each unit coil may be electrically connected to the second elementary coil in series or in parallel.

The unit coils may be electrically connected to each other in series or in parallel.

The unit coils may be electrically connected to a separate power source.

A high frequency coil may further comprise capacitors inserted in each of the elementary coil of at least one of the plurality of unit coils so as to the capacitors are connected in series to at least one of the two line sections.

In the second aspect of the present invention, a high frequency coil comprises:

a plurality of unit coils having a first elementary coil including two line sections in parallel with each other and a second elementary coil including two line sections in parallel with the two line sections of the first elementary coil;

each of the four line sections included in the unit coil having substantially its longitudinal center on a plane perpendicular to the line sections;

the four line sections included in each unit coil occupying respective corners of a rectangle on the plane, each of the rectangles formed of the unit coils including a common central point and corresponding sides of the rectangles being disposed in parallel with each other; and the line sections in each unit coil respectively being electrically connected so as to generate a magnetic flux in the same direction at the common central point.

Here, let the common central point represent an origin of a coordinate, let an axis disposed in parallel with one side of the rectangle represent x axis, an axis disposed perpendicular to the x axis represent y axis, let the number of the unit coils be N and let a coordinate value of a conductor located in a first quadrant of the x-y plane among four line sections, comprising an n-th unit coil be $(x_{Ln}, y_{Ln})$, the coordinate values $x_{Lnop}$ and $y_{Lnop}$ may be within the range of optimum coordinate value $x_{Lnop} \pm 10\%$ and $y_{Lnop} \pm 10\%$ respectively, the optimum coordinate $(x_{Lnop}, y_{Lnop})$ being determined as the coordinate value of each unit coil provided in such a manner that the coefficients of the terms from 2nd to $(4N-2)$-th become zero among coefficients of terms provided when power series expansion is performed over the distribution on the y axis of the magnetic flux generated by the high frequency coil.

The first elementary coil included in the each unit coil may be electrically connected to the second elementary coil in series or in parallel.

The unit coils may be electrically connected to each other in series or in parallel.

The unit coils may be electrically connected to a separate power sources.

A high frequency coil may further comprise capacitors inserted in each of the elementary coils of at least one of the plurality of unit coils so that the capacitors are connected in series to at least one of the two line sections.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Hereinafter, the present invention will be described with reference to the preferred embodiments.

Embodiment 1

Figure 4:
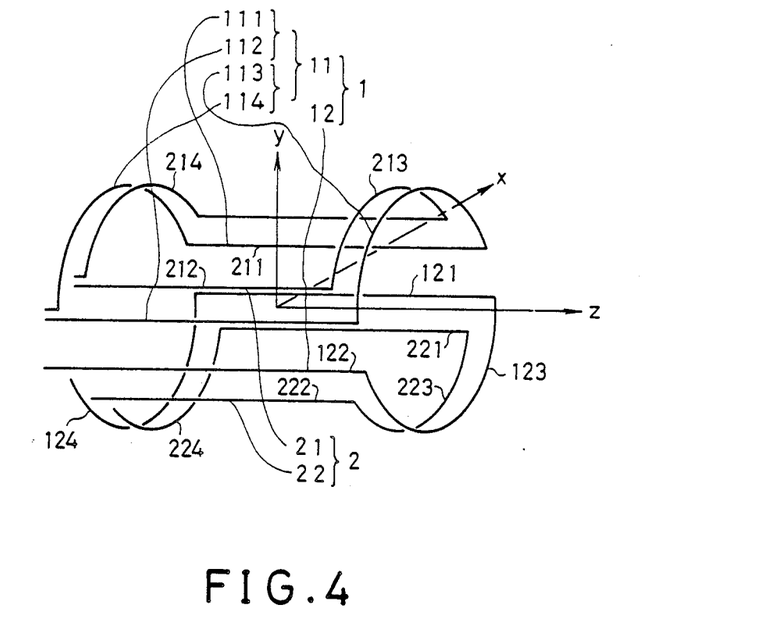
FIG. 4 is a perspective view showing a preferred embodiment of a high frequency coil according to the present invention.

FIG. 4 is a perspective view showing an embodiment of the present invention. The high frequency coil of this embodiment is composed of a first unit coil 1 having two saddle shaped coils 11 and 12 and a second unit coil 2 having two saddle shaped coils 21 and 22. The saddle shaped coil 11 includes two line sections 111 and 112 located in parallel with each other and two arc sections 113 and 114 provided on both ends of the line sections and the saddle shaped coil 12 includes two line sections 121 and 122 located in parallel with each other and two arc sections 123 and 124. Likewise, the saddle shaped coils 21 and 22, respectively, include line sections 211, 212 and 221, 222 respectively located in parallel with each other and arc sections 213, 214 and 223, 224.

The saddle shaped coils 11 and 12, and saddle shaped coils 21 and 22 may be connected in series or in parallel with each other, respectively. The first unit coil 1 may be connected to the second unit coil 2 in series or in parallel, and in addition, they may be each connected to an independent power source.

The first unit coil 1 is combined with the second unit coil 2 in such a manner that they include a common center and a common longitudinal central axis. This center is assumed as an origin 0 of a coordinate axis and the longitudinal central axis is also assumed as a z axis. Further, the axis provided on the plane containing the origin 0 and in parallel with the plane containing the line sections 111 and 112 and perpendicular to the z axis is assumed as an x axis. The axis perpendicular to the x axis and the z axis is assumed as a y axis.

Moreover, the saddle shaped coils are disposed in such a manner that these coils 11, 12, 21 and 22 are each symmetric to one another relative to the x-y plane and the y-z plane, and line sections of the saddle shaped coils 11, 12 and the line sections of the saddle shaped coils 21, 22 are symmetric to each other relative to the x-z plane. The symmetry relative to the x-y plane, however, requires less accuracy than the symmetry relative to the other planes.

Figure 5:
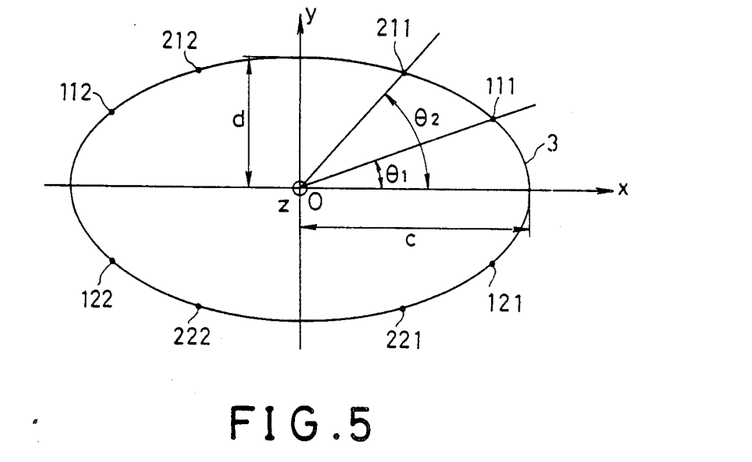
FIG. 5 is a sectional view taken along the x-y plane of the embodiment shown in FIG. 4.

FIG. 5 is a sectional view taken along the x-y plane of the high frequency coil shown in FIG. 4. The positions of the line sections of the saddle shaped coils are indicated therein and are symmetric to the x axis and the y axis. Reference numeral 3 denotes an elliptical cylinder type bobbin on which all the line sections 111, 112, 121, 122, 211, 212, 221 and 222 are disposed. On the x-y plane, the line sections 111, 112, 121 and 122 are located on each corner of a rectangle and the line sections 211, 212 221 and 222 are located on each corner of another rectangle. Assuming the direction of the current flowing through the line section 111 as the direction for decreasing z (the current flows from the face side of the page to the reverse side of the page of FIG. 5), these saddle shaped coils are connected to one another in such a manner that the line section 211 in the first quadrant and the line sections 121 and 221 in the fourth quadrant have the same direction of the current as the line section 111, and the line sections 112, 212, 122 and 222 in the second and third quadrant have the opposite direction of the current to the line section 111. Thus, the magnetic flux on the y axis generated by the currents flowing through these line sections directs to the incremental direction on the y axis. The definition of the positions of the line sections 111 and 211 in the first quadrant results in the definition of the positions of the other line sections in terms of their symmetry.

As shown in FIG. 5, assuming an angle between the x axis and the line extending from the origin to the line section 111 in the first quadrant relative to the first unit coil as $\theta_1$ and an angle relative to the second unit coil 2 as $\theta_2$, the definition of these angles $\theta_1$ and $\theta_2$ uniquely defines the positions of all the line sections on the ellipse.

The magnetic flux density distribution generated on the y axis by these first and second unit coils are denoted by the following equations, which are power series relative to y.

$$B_1(y) = B_0 + A_2 y^2 + A_4 y^4 + A_6 y^6 + A_{2m} y^{2m} + \ldots \quad (8)$$

$$B_2(y) = B_0 + C_2 y^2 + C_4 y^4 + C_6 y^6 + C_{2m} y^{2m} + \ldots \quad (9)$$

where,
$B_1(y)$: Magnetic flux density distribution generated by the first unit coil 1
$A_{2m}$: Coefficient of the 2m-th order term $B_2(y)$: Magnetic flux density distribution generated by the second unit coil
$C_{2m}$: Coefficient of the 2m-th order term The coefficients $A_{2m}$ and $C_{2m}$ correspond to $G_{2m}$ in the above-mentioned equation (2). Thus, these coefficients can be represented by the following equations with reference to the equation (4).

$$A_{2m} = \frac{1}{(2m)!} \cdot \frac{d^{2m} B_1(y)}{dy^{2m}} \quad (10)$$

$$C_{2m} = \frac{1}{(2m)!} \cdot \frac{d^{2m} B_2(y)}{dy^{2m}} \quad (11)$$

As described above, $G_{2m}$ is a function relative to the coordinate (a, b) of the line section, and accordingly to the angle $\theta$ between the line extending from the origin to the line section. Likewise, $A_{2m}$ is a function relative to the angle $\theta_1$, and $C_{2m}$ is a function relative to the angle $\theta_2$. In addition, these coefficients are also functions relative to the form and size of the ellipse on which each line section is disposed, but in this case, it is not necessary to consider these functions since the form and size are constant. If we let the resultant distribution of combining the two magnetic flux density distributions be $B_3(y)$, it is represented by the following equation.

$$\begin{aligned} B_3(y) &= B_1(y) + B_2(y) \\ &= 2B_0 + (A_2 + C_2)y^2 + (A_4 + C_4)y^4 + \\ &\quad (A_6 + C_6)y^6 + \ldots + (A_{2m} + C_{2m})y^{2m} + \ldots \end{aligned} \quad (12)$$

In actuality, y is less than 1, so that the lower order terms shown in the equation (12) more greatly influence the uniformity deterioration of a magnetic field. Hence, the optimum condition for the first and second unit coils configuration of the high frequency coil is obtained by deleting the coefficients of the terms from lower order to higher order except the 0th order term. For the deletion, there are only two variables $\theta_1$ and $\theta_2$, so that the optimum condition is assumed as deleting the coefficients of the second and fourth order terms. That is, the condition is assumed as obtaining unknowns $\theta_1$ and $\theta_2$ for satisfying the following two equations.

$$\left.\begin{aligned} A_2(\theta_1) + C_2(\theta_2) &= 0 \\ A_4(\theta_1) + C_4(\theta_2) &= 0 \end{aligned}\right\} \quad (13)$$

Since these simultaneous equations are not linear, the solutions, which are as accurate as required, can be obtained by means of iterative calculation such as the Newton-Raphson method.

In the high frequency coil composed of four unit coils, each composed of two saddle shaped coils, the simultaneous equations for obtaining the optimum angles of each coil, $\theta_1$, $\theta_2$, $\theta_3$ and $\theta_4$ are as follows.

$$\left.\begin{array}{l} A_2(\theta_1) + C_2(\theta_2) + D_2(\theta_3) + E_2(\theta_4) = 0 \\ A_4(\theta_1) + C_4(\theta_2) + D_4(\theta_3) + E_4(\theta_4) = 0 \\ A_6(\theta_1) + C_6(\theta_2) + D_6(\theta_3) + E_6(\theta_4) = 0 \\ A_8(\theta_1) + C_8(\theta_2) + D_8(\theta_3) + E_8(\theta_4) = 0 \end{array}\right\} \quad (14)$$

In these equations, the functions D and E denote, respectively, the coefficients of each term of power series on y, which is obtained by expanding the magnetic field distribution on the y axis generated by the third and fourth unit coil. The index number denotes an order.

Each coefficient is also a function relative to several conditions such as length of a line section and form of an arc section (not shown in FIG. 5), so that, it is necessary to design finally an optimum coil on the basis of the detailed calculations of magnetic flux density performed in consideration of these conditions. How to do it will be described below.

The Biot-Savart's Law, which is well known in the field of electromagnetics, is used for calculating the density of the magnetic flux generated by a high frequency coil in consideration of a definite length of the line section and the arc section. This Law represents the equation for obtaining the magnetic field distribution generated by small current flowing through the segment of line, as described below.

$$B(x,y,z) = \frac{\mu_0 i}{4\pi} \cdot \frac{e_i \times e_r}{r^3} \quad (15)$$

where,

B (x,y,z): Magnetic flux density of the coordinate (x,y,z) when a certain position, at which a small current is flowing, is assumed as an origin i: Magnetic of the small current r: Distance between the position with the magnetic flux density B and the origin $e_i$, $e_r$: Three dimentional vectors for the small current i and the distance r The magnetic flux density B(x,y,z) at any point (x,y,z) can be calculated by integrating this equation (15) along a conductor of saddle shaped coil and accumulating the results relative to all the saddle shaped coils, that is, by the following equation.

$$B(x,y,z) = \frac{\mu_0 I}{4\pi} \cdot \sum_{n=1}^{N} \int_{C_n} \frac{e_i \times e_r}{r^3} dl \quad (16)$$

where,

I: Current flowing through the conductor of each saddle shaped coil

N: Number of unit coils each composed of two saddle shaped coils $C_n$: Indicates integration of all the conductors in the n-th unit coil dl: Small segment of line on the $C_n$-th unit coil r: Distance between the small segment of line and the point (x,y,z)

$e_t$: Unit vector showing the direction of the current flowing through the small segment of line $e_r$: Unit vector direction from the small segment of line dl to the point (x,y,z)

For obtaining the optimum condition for a high frequency coil, it is necessary to differentiate B(0,y,0), which is a value of B(x,y,z) on the y axis shown in the above-mentioned equation, with respect to y. For the method, it is also possible to obtain a coefficient of an m-th order term by using an equation obtained by differentiating B(0,y,0) m times relative to y in place of the equation in the integral of the above equation (16). Yet, in actuality, a more suitable method for numeral calculations using a computer is a difference method, that is, a numerical differentiaion, in place of a differential method. Namely, assuming $y_m = \cdot \Delta y$, it is possible to obtain B(0,0,0), B(0,$y_1$,0), B(0,$y_2$,0), B(0,$y_3$,0) . . . B(0,$y_m$,0). Then, if we let each of them be $B_0$, $B_1$, $B_2$, $B_3$ and $B_m$, the following difference equation provides an approximate value $G_k$ produced as a result of k times differential of B(0,y,0).

$$\left.\begin{array}{l} G_0 = B_0 \\ G_2 = (B_1 - B_0)/(\Delta y)^2 \\ G_4 = (B_2 - 4B_1 + 3B_0)/(\Delta y)^4 \\ G_6 = (B_3 - 6B_2 + 15B_1 - 10B_0)/(\Delta y)^6 \\ G_{2m} = (B_m + \times \, _{2m}C_1 B_{m-1} + \, _{2m}C_2 B_{m-2} + \\ \ldots + \, _{2m}C_m/2 \cdot B_0)/(\Delta y)^{2m} \end{array}\right\} \quad (17)$$

These equations become more accurate as $\Delta y$ becomes smaller, while it is necessary to choose a proper value since the error due to digit drop becomes larger as $\Delta y$ becomes smaller. Yet, in the computer program, the definition of a double precision real number to a real number does not normally bring about any problem.

For obtaining the optimum value of $\theta$ for representing the position of the line section of the saddle shaped coil, the above-mentioned simultaneous equations are solved in accordance with the following procedure.

(a) An initial value of an angle $\theta$ for each unit coil is assumed as the angle $\theta$ for the optimum condition obtained in accordance with the approximation condition described later.

(b) Let a coefficient of a term with each order corresponding to this $\theta$ be $G_{2m0}$. $G_{2m0}$ is calculated by the equation (17).

(c) $G_{2m}$ is a function of $\theta$ relative to a saddle shaped coil. It can be approximated by the following equation. This approximation is also one of the tactics for solving non-linear simultaneous equations.

$$G_{2m} = \sum_{j=1}^{N} \alpha_{2mj}(\theta_j - \theta_{j0}); (m = 0,2,4 \ldots ,M) \quad (18)$$

(d) Let a coefficient of each order term be $G_{2mn}$, for which the angle of the n-th unit coil $\theta_n$ is slightly varied as $\theta_n \rightarrow \theta_n + \Delta\theta$. This $G_{2mn}$ is calculated by means of the equation (17) in a similar manner to (b). The coefficient $\alpha_{2mj}$ of the above equation is calculated by the equation shown below.

$$\alpha_{2mj} = (G_{2mn} - G_{2m0})/\Delta\theta$$

(e) The above two equations compose linear simultaneous equations of N dimension with unknonw $\theta_j$ (j=1,2,3, . . . ,N) bu subsituting this $\alpha_{2mj}$ into $G_{2m}$. By solving these equations, it is possible to obtain more nearly optimum condition than the condition brought about by approximation of an angle of each unit coil as described above. A much more nearly optimum value of $\theta$ can be obtained by calculating this newly obtained value $\theta$ from the (b) items again.

As described above, the iterative calculation allows the condition to come closer to the true optimum condition. Since the variation of $\theta$ is made smaller in each iteration time, however, it is proper to stop the calculation when accuracy is recognized to be satisfactory. Yet, the iterative calculation converges only when $\theta$ has a proper initial value, so that this initial value of $\theta$ must be a value close to the optimum value. If the value of $\theta$ is far away from the optimum value, it may acceleratingly increase and diverge without obtaining the convergent result of the iterative calculation. Hence, the setting of an initial value of $\theta$ is very important relative to the iterative calculation. It is better to use as this initial value the value of $\theta$ of each unit coil provided as the optimum condition by approximation calculation, where the line section has infinite length. The calculating result of using this value will be described later.

Furthermore, if a large conductor stays near the high frequency coil and the eddy current of this conductor generated by a high frequency electromagnetic wave affects the above-mentioned magnetic flux density distribution $B(0,y,0)$ or if a magnetic substance stays near it and affects the value of $B(0,y,0)$ in a similar manner, the above-mentioned magnetic flux density distribution calculation using integration may provide a different distribution from the actual one. To cope with such a case, it is necessary to employ a higher level magnetic field calculation method including a finite element method, a boundary element method or a method of separating variables, but the basic method is fixed for obtaining the optimum condition.

As described relative to the prior art, the calculating result provided on the approximate condition where the line section has infinite length is close to the accurate optimum condition, so that the optimum condition can be roughly grasped by using this simple approximate condition. Further, the optimum angle $\theta_{OP}$ provided under the approximate condition is very important to an initial value in case of obtaining the accurate optimum condition in which the form of the saddle shaped coil is considered by means of the iterative calculation.

The equation of the magnetic flux density $B(y)$ in case of this approximate condition is a simple algebraic expression as shown in the above-mentioned equation (3), so that it can be differentiated with respect to y many times. Thus, it is not necessary to approximate a value to be differentiated by means of the equation (17). The calculating results under the approximate condition are shown in FIGS. 6, 7, and 8, where the number of unit coils are 2, 3 or 4, respectively.

Figure 6:
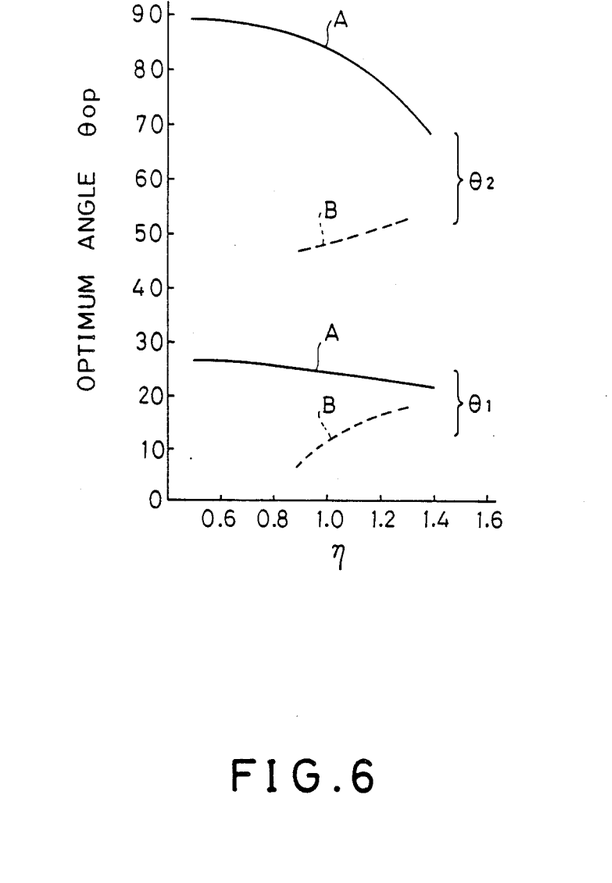
FIGS. 6 to 8 are diagrams, respectively, illustrating the relationships between an optimum angle $O_{OP}$ and a ratio of major axis to minor axis of an ellipse $\eta$, where the number of unit coils of a high frequency coil according to the present invention are 2, 3 or 4.
Figure 7:
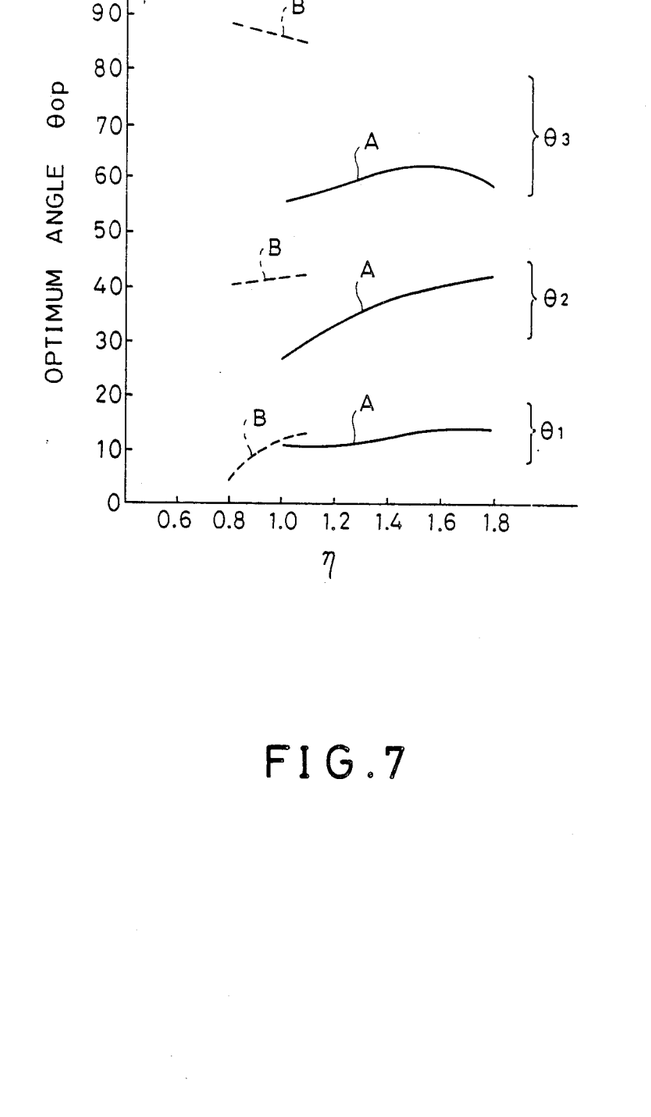
Figure 8:
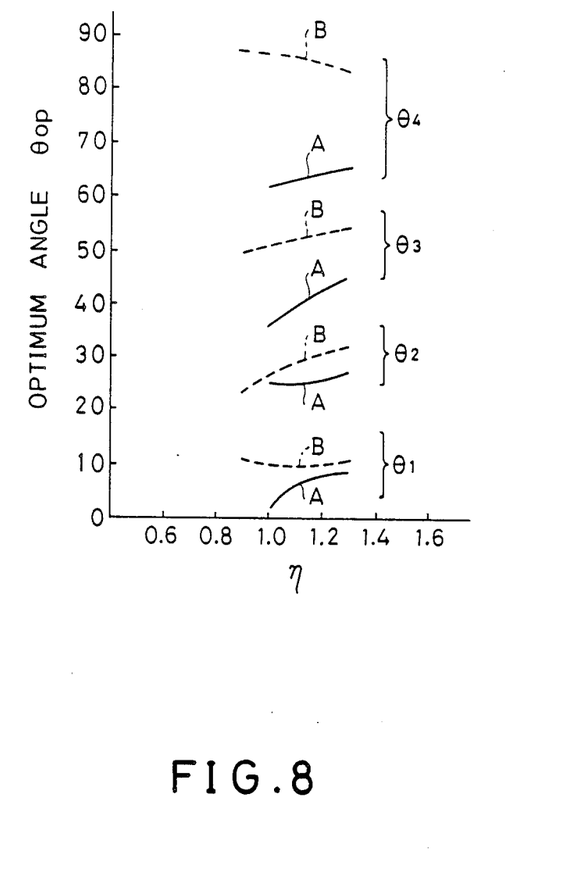

In FIGS. 6, 7 and 8, the axis of abscissa $\eta$ represents d/c, that is, a ratio of major axis c to minor axis d of the ellipse shown in FIG. 5. The ordinate axis represents the optimum angle $\theta_{OP}$. The full line A and the dotted line B, respectively, stand for a combination of several optimum angles $\theta_{OP}$. Thus, two pair of optimum angles are provided for one ellipse form.

The most preferable state is that the angle $\theta$ of the line sections of each unit coil located in the first quadrant meets with the optimum angle $\theta_{OP}$. This angle $\theta$ is allowed to be in the range of $\theta_{OP} \pm 5°$, but if $\theta$ exceeds this range the uniformity of a magnetic field is remarkably distorted.

In this embodiment, the sectional position of the line section of the coil is assumed to be on one ellipse, because the section in the normal checking state, where a human body lies on his back, is defined by his shoulder width relative to the horizontal size and by his head thickness relative to the vertical size. The human body normally has a longer shoulder width than the head thickness. Hence, it is proper to employ an elliptic form, which is longer in width than a circle, for the purpose of enclosing a human body and providing a coil as closely to a human body as possible. Moreover, in actuality, when of manufacturing it, a coil conductor is shaped on a predetermined bobbin by bending. Further, a number of coils are wound on the bobbin so as to reduce their occupied space in the radial direction of a high frequency coil. In addition, in the graphs showing the above-mentioned calculating results, an ellipse is horizontally longer when the axis ratio of the ellipse is smaller than 1 and is vertically longer when it is larger than 1. When the high frequency coil employs an ellipse which is vertically longer, it is better to dispose it in such a manner that the x axis and the y axis are interchanged, in other words, the arc sections are not located vertically but located in the longitudinal direction of the elliptic cylinder. The difference between the two cases is caused because of the manner of setting the coordinate system and thus, of course, both cases do not depart from the spirit of the present invention.

The construction of a high frequency coil as described above allows a coefficient of each term of a power series to be 0 in such a manner that in case of two unit coils, the coefficients of terms up to 4th order, in case of three unit coils, the coefficients of terms up to 6th order and in case of four unit coils, the coefficients of terms with up to 8th order are all allowed to be 0. Consequently, this construction can achieve a high frequency coil having far more uniformity in comparison with the conventional high frequency coil including only one unit coil.

Embodiment 2

Figure 9:
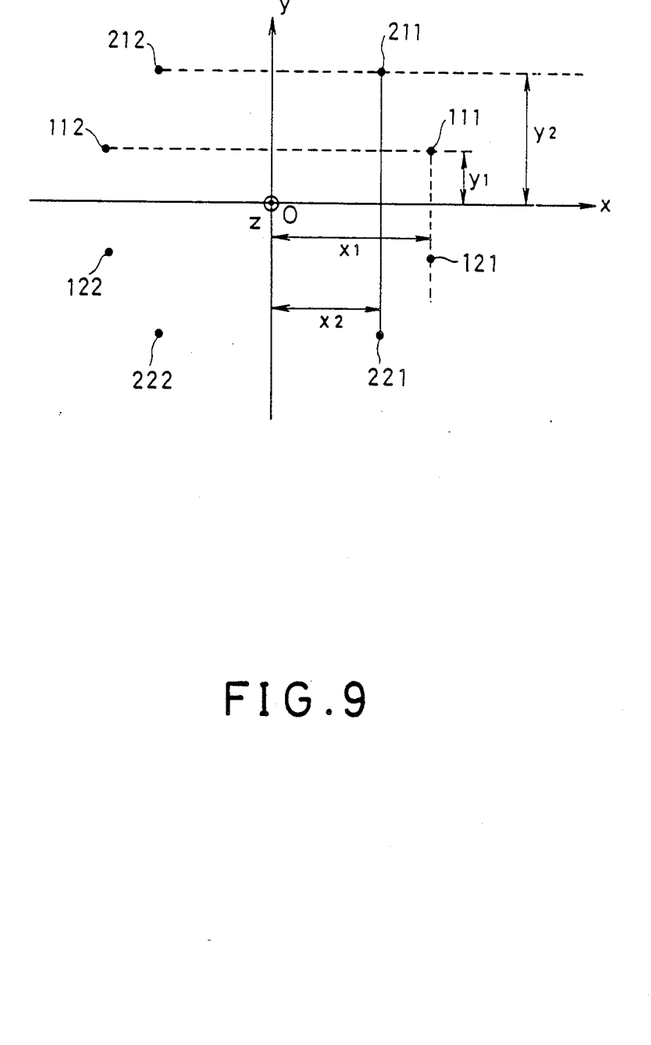
FIG. 9 is a sectional view taken along the x-y plane of a high frequency coil of another preferred embodiment according to the present invention.

The other preferred embodiment of a high frequency coil according to the present invention will be described here inafter with reference to FIG. 9. FIG. 9 shows a high frequency coil having a first unit coil composed of two saddle shaped coils each including line sections 111, 112 and 121, 122 and a second unit coil composed of two saddle shaped coils each including line sections 211, 212 and 221, 222 and is a sectional view cut along the plane perpendicular to the line sections. Each saddle shaped coil and electrical connections between the saddle shaped coils and the unit coils has been already described with respect to the embodiment 1.

The line sections 111, 112, 121 and 122 and the line sections 211, 212, 221 and 222 of both unit coils respectively occupy corners of rectangles on the plane perpendicular thereto. The two rectangles include their centers common to each other and the corresponding sides, for example, sides 111-112 and 211-212 and sides 111-121 and 211-221 are in parallel with each other. In other words, assuming an axis disposed in parallel with one side of the rectangle and passing through the center 0 as x axis, an axis disposed in parallel with the other side of the rectangle and passing through the center 0 as y axis and an axis disposed perpendicular to the x axis and the y axis as z axis, the four line sections 111, 112, 211 and 212 and the other four line sections 121, 122, 221 and 222 are symmetric to each other relative to the x-z plane. Likewise, the line sections 111, 121, 211 and 221 and the other four line sections 112, 122, 212 and 222 are symmetric to each other relative to the y-z plane. The symmetry relative to the x-y plane, however, requires less accuracy than the symmetry relative to the other planes. It is preferable to dispose all the line sections on the peripheral surface of an elliptic cylinder.

In the coordinate system using the x axis and the y axis as described above, the coordinate of the line section 111 located in the first quadrant is $(x_1, Y_1)$ and that of the line section 211 is $(x_2, y_2)$ as shown in FIG. 9.

The optimum condition for construction of each unit coil of a high frequency coil is to delete as many coefficients of higher order terms as possible in the equation (12) as shown in the method described with respect to the embodiment 1. In this embodiment, the unknown for deletion is a coordinate value $(x_{Ln}, y_{Ln})$ of a line section of each unit coil. For two unit coils, four variables are provided as in this embodiment. If the two line sections have the same relative positions as each other, the magnetic flux distributions generated by them resembles to each other, so that one of the four coordinate values is fixed and the other three values are assumed as unknowns. Hence, for two unit coils, the coefficients of the terms with degrees of 2, 4 and 6 can be made zero. Assuming the fixed coordinate value as $x_{L1}$, that is, x axis value of a first unit coil and $y_{L1}, x_{L2}, y_{L2}$ as three unknowns, the optimum coordinate values $(x_{Ln}, y_{Ln})$ (n=1,2) can be obtained by solving the following three dimensional simultaneous equations.

$$A_2(x_{L1}, y_{L1}) + C_2(x_{L2}, y_{L2}) = 0$$
$$A_4(x_{L1}, y_{L1}) + C_4(x_{L2}, y_{L2}) = 0 \quad (19)$$
$$A_6(x_{L1}, y_{L1}) + C_6(x_{L2}, y_{L2}) = 0$$

These three dimensional simultaneous equations are not of a linear type, so that these solutions can be obtained as exactly as required by means of an iterative calculation method such as the Newton-Raphson method.

For three unit coils, five unknowns $y_{L1}, x_{L2}, y_{L2}, x_{L3}, y_{L3}$ are provided, which are obtained by the following simultaneous equations. The coefficients of the terms from 1st to 10th order can be made zero. The function D shown in this equation denotes a coefficient of each term in the power series expanded the magnetic field distribution on the y axis generated by a third unit coil relative to y. The numerical values of indexes denote order.

$$A_2(a_1,b_1) + C_2(a_2,b_2) + D_2(a_3,b_3) = 0$$
$$A_4(a_1,b_1) + C_4(a_2,b_2) + D_4(a_3,b_3) = 0$$
$$A_6(a_1,b_1) + C_6(a_2,b_2) + D_6(a_3,b_3) = 0 \quad (20)$$
$$A_8(a_1,b_1) + C_8(a_2,b_2) + D_8(a_3,b_3) = 0$$
$$A_{10}(a_1,b_1) + C_{10}(a_2,b_2) + D_{10}(a_3,b_3) = 0$$

For four unit coils, seven unknowns are provided, so that the coefficients of terms from 1st to 14th order can be deleted. In addition, considering that the coefficients of odd order terms are all made zero because of the symmetric construction of the coil, for N number unit coils, the number of elements to be solved in the simultaneous equations is 2N−1 and the coefficients of terms ranging from 2nd to (4N−2)-th order can be made zero.

In this embodiment, in order to design an optimum coil on the exact magnetic flux density calculation considering some factors such as the actual form of a high frequency coil, it is possible to obtain the accurate optimum condition by means of the method described with regard to the embodiment 1.

The optimum condition can be also provided by obtaining the magnetic flux density B(y) using the equation (3). The following values indicate the calculated results of the optimum coordinate values $(x_{Lnop}, y_{Lnop})$ in the approximate condition in case of two or three unit coils. This calculation is performed as setting the coordinate value of $x_1$ be 1 and the other coordinate values are represented as relative values.

(a) For two unit coils,
$x_1 = 1.000000, y_1 = 0.299437$
$x_2 = 0.726390, y_2 = 0.917547$ (b) For three unit coil,
$x_1 = 1.000000, y_1 = 0.204198$
$x_2 = 0.879327, y_2 = 0.618183$
$x_3 = 0.592212, y_3 = 1.057506$ It is the most preferable to allow an x coordinate and a y coordinate of a line section located in a first quadrant among the line sections composing each unit coil to be the same with an optimum coordinate $x_{Lnop}$ and $y_{Lnop}$. The above-described x coordinate $x_{Ln}$ and $y_{Ln}$, however, may be in the range of $x_{Lnop} \pm 10\%$ and $y_{Lnop} \pm 10\%$. It is better to avoid exceeding the limit since uniformity of a magnetic field is remarkably distorted in doing so.

Since, as described above, the high frequency coil is composed of plural unit coils, in addition to the coefficients of odd order terms, the coefficients of terms up to 6th, 10th, and (4N−2)-th order are allowed to be zero for two, three, and N unit coils, respectively. Accordingly, it is possible to obtain a high frequency coil providing far more better uniformity than the conventional high frequency coil consisting of one unit coil.

The high frequency coil of the present invention is constructed by a plurality of unit coils each having two saddle shaped coils which are vertically symmetric to each other as described above. According to the present invention, let N be the number of unit coils and employing the x-y plane coordinate position of a conductor located in a first quadrant, and defining the optimum coordinate position of each unit coil where the coefficients of the terms except that with an order of 0 are made zero among coefficients of respective order terms provided when power series expansion relative to y is performed over the distribution on the y axis of the magnetic flux generated by the high frequency coil, and disposing each unit coil at the coordinate position near the optimum coordinate position. Therefore, since this high frequency coil keeps the uniform space as widely as required and, besides, is reduced in size, this coil contributes to reducing the size of the overall MRI system and lowering the cost. Furthermore, the high frequency coil is allowed to come closer to an object body, so that the high frequency electromagnetic wave is radiated to nuclei to more intensely cause nuclear to magnetic resonance, and the sensitivity of the resonance signal is improved. As a result, it is possible to obtain a sectional image with little turbulence.

Embodiment 3

Figure 10:
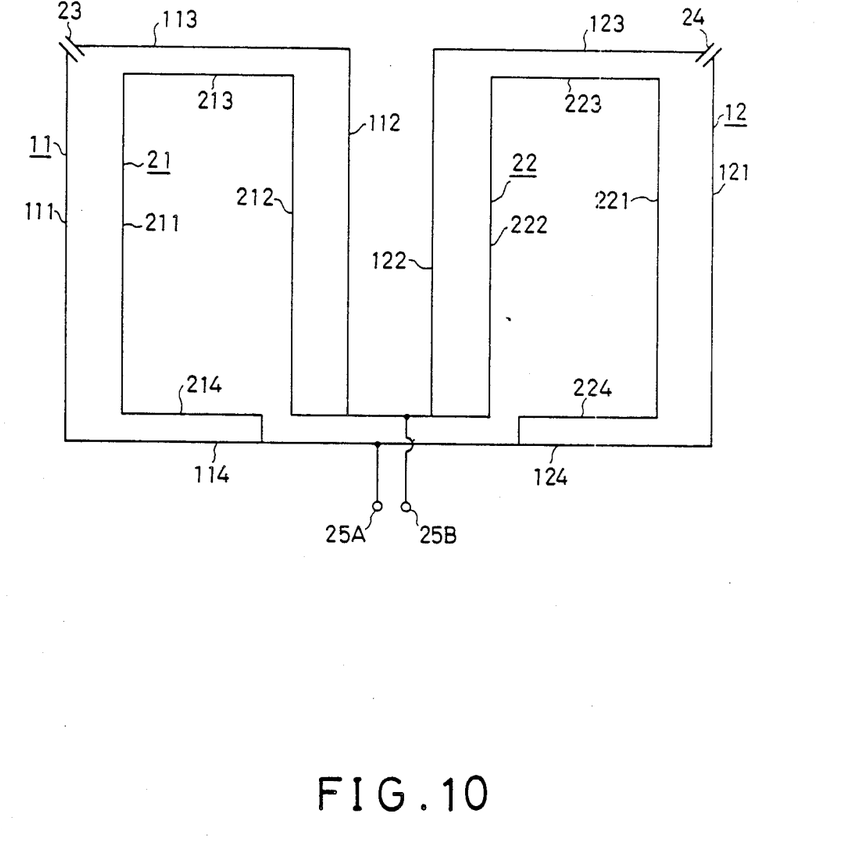
FIG. 10 is a schematic view showing a further embodiment of a high frequency coil according to the present invention.

FIG. 10 is a development view showing another embodiment of a high frequency coil according to the present invention. Saddle shaped coils 11 and 12, which are placed on upper side in FIG. 4, are electrically connected in parallel with each other and saddle shaped coils 12 and 22, which are placed on lower side in FIG. 4, are also electrically connected in parallel with each other. Furthermore, all saddle shaped coils are connected in parallel with each other. At a connecting portion between the line section 111 and the arc section 113 a capacitor 23 is inserted in such a manner that the capacitor 23 is electrically connected in series with the line section 111 and the arc section 113. No capacitor is connected in the saddle shaped coil 21. Similarly a capacitor 24 is inserted in the saddle shaped coil 23 between the line section 121 and the arc section 123.

For placing the line sections 111, 112, 211 and 212 on the before-mentioned optimum position, the length of the arc sections 213 and 214 are shorter than that of the arc sections 113 and 114, respectively. The length of the arc sections 223 and 224 are also shorter than that of the arc sections 123 and 124, respectively. A high frequency voltage is applied to the saddle shaped coils 11, 12, 21 and 22 through the terminals 25A and 25B.

When the saddle shaped coils of each unit coil are connected in parallel with each other, the electrical length of the conductor becomes shorter and the stray capacity becomes smaller. However, the electric currents which flow through each saddle shaped coil are determined by the self-inductance of each saddle shaped coil and mutual inductance thereof, so that the electric currents flowing through each saddle shaped coil are not identical.

By connecting the capacitor 23 to the conductor, as shown in FIG. 10, it is able to reduce the impedance of the saddle shaped coil 11 to the impedance value of the saddle shaped coil 21. Hence, the electric currents flowing the coils 11 and 21 can be balanced. In like manner, by connecting the capacitor 24 to the line section 121 and the arc section 123 the electric currents flowing the coils 12 and 22 can be balanced.

Capacitors 23 and 24 are inserted in saddle shaped coils 11 and 12 at the connecting portions between the line section and the arc section of each coil respectively. The connecting portions are ordinarily formed by bending one conductor or welding conductors. However, by inserting the capacitor at this portion the line section is connected to the arc section through the capacitor, so that the line section and arc section are easily connected with each other. Capacitors 23 and 24 must have such characteristics that they can be used at an applied frequency and voltage of several tens of megahertz and several kilovolts.

Alternatively, the arc sections 213, 214, 223 and 224 may not be provided and the line section 211 may be connected to the arc sections 113 and 114 and the line section 212 may be connected to the arc section 113 and the terminal 25B, similarly the line section 221 may be connected to the arc sections 123 and 124 and the line section 222 may be connected to the arc section 123 and terminal 25B. In this case, it is preferable that capacitors are inserted between the line section 111 and arc section 113, line section 112 and arc section 113, line section 121 and arc section 123, and line section 122 and arc section 123. By inserting capacitors, the electric currents flowing through each coil can be balanced.

The invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A high frequency coil comprising:
   a plurality of unit coils each of which has a first elementary coil including two line sections in parallel with each other and a second elementary coil confronting said first elementary coil and including two line sections in parallel with said two line sections of said first elementary coil;
   all of said line sections included in said plurality of unit coils being provided on an outer peripheral surface of a common elliptic cylinder and having their longitudinal centers substantially on one plane which intersects perpendicularly the center axis of said elliptic cylinder;
   said four line sections included in each unit coil occupying respective corners of a rectangle on said plane, each of said rectangles formed of said unit coils including a common central point and corresponding sides of each of said rectangles being disposed in parallel with each other; and
   said line sections in each said unit coil being respectively electrically connected so as to generate a magnetic flux in the same direction at said common central point.

2. A high frequency coil as claimed in claim 1, wherein when an origin of a coordinate is defined with said common central point, the x and y axes of said coordinate are defined with one of a major axis and a minor axis of an ellipse formed in section of said elliptic cylinder cut along said plane respectively, and when an angle between said x axis and a line extending from said origin to a position of the line section located in a first quadrant of the x-y plane chosen among said four line sections of each unit coil is defined as $\theta$, said angle $\theta$ is within a range of five degrees of an optimum angle $\theta op$, said optimum angle $\theta op$ being determined as the angle of each unit coil provided in such a manner that the coefficients of the terms up to order twice as many as the number of coils become zero except the 0th order term among the coefficients of terms provided when a power series expansion relative to y is performed over the distribution on the y axis of the magnetic flux density generated by said high frequency coil.

3. A high frequency coil as claimed in claim 1, wherein said first elementary coil included in said each unit coil is electrically connected to said second elementary coil in series.

4. A high frequency coil as claimed in claim 1, wherein said first elementary coil included in said each unit coil is electrically connected to said second elementary coil in parallel.

5. A high frequency coil as claimed in claim 1, wherein said unit coils are electrically connected to each other in series.

6. A high frequency coil as claimed in claim 1, wherein said unit coils are electrically connected to each other in parallel.

7. A high frequency coil as claimed in claim 1, wherein said unit coils are electrically connected to a separate power source.

8. A high frequency coil as claimed in claim 1, further comprising capacitors being disposed in each of said elementary coils of at least one of said plurality of unit coils in such a manner that each of said capacitors is connected in series with at least one of said two line sections.

9. A high frequency coil comprising:

a plurality of unit coils each of which has a first elementary coil including two line sections in parallel with each other and a second elementary coil confronting said first elementary coil and including two line sections in parallel with said two line sections of said first elementary coil;

all of said line sections included in said plurality of unit coils having their longitudinal centers substantially on a common plane perpendicular to said line sections;

said line sections included in each unit coil occupying respective corners of a rectangle on said plane, each said rectangle formed of said unit coils including a common central point and corresponding sides of each said rectangle being respectively disposed in parallel with each other;

said line sections in said each unit coil being respectively electrically connected so as to generate a magnetic flux in the same direction at said common central point; and when an origin of a coordinate system is defined to coincide with said common central point, directions of the x and y axes as defined in parallel with respective orthogonal sides of said rectangles, N is defined as the number of said unit coils, and when a coordinate value of one of said line sections located in a first quadrant of the x-y plane of said coordinate system among four line sections composing an n-th one of said unit coils is defined as $(x_{Ln}, Y_{Ln})$, said coordinate values $(x_{Ln}, Y_{Ln})$ are within the range of 10% of an optimum coordinate value $x_{Lno}p$ and $y_{Lno}p$ respectively, said optimum coordinate value $(x_{Lno}p, y_{Lno}p)$ being determined as the coordinate value of each unit coil provided in such a manner that the coefficients of the terms from 2nd to $(4N-2)$-th become zero among coefficients of terms provided when a power series expansion is performed over the distribution on the y axis of the magnetic flux generated by said high frequency coil.

10. A high frequency coil as claimed in claim 9, wherein said first elementary coil included in said each unit coil is electrically connected to said second elementary coil in series.

11. A high frequency coil as claimed in claim 9, wherein said first elementary coil included in said each unit coil is electrically connected to said second elementary coil in parallel.

12. A high frequency coil as claimed in claim 9, wherein said unit coils are electrically connected to each other in series.

13. A high frequency coil as claimed in claim 9, wherein said unit coils are electrically connected to each other in parallel.

14. A high frequency coil as claimed in claim 9, wherein said unit coils are electrically connected to a separate each power source.

15. A high frequency coil as claimed in claim 9, further comprising capacitors disposed in each of said elementary coils of at least one of said plurality of unit coils in such a manner that each of said capacitors is connected in series with at least one of said line sections.

* * * * *